United States Patent
Wu

(10) Patent No.: US 9,627,054 B2
(45) Date of Patent: Apr. 18, 2017

(54) MEMORY OPERATING METHOD FOR INCREASING CELL CAPACITY BASED ON RESISTANCE CHARACTERISTIC OF MEMORY AND ASSOCIATED MEMORY DEVICE

(71) Applicant: MACRONIX INTERNATIONAL CO., LTD., Hsinchu (TW)

(72) Inventor: Chao-I Wu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/711,867

(22) Filed: May 14, 2015

(65) Prior Publication Data

US 2016/0217852 A1    Jul. 28, 2016

Related U.S. Application Data

(60) Provisional application No. 62/106,276, filed on Jan. 22, 2015.

(51) Int. Cl.
*G11C 11/00* (2006.01)
*G11C 13/00* (2006.01)
*G11C 11/56* (2006.01)

(52) U.S. Cl.
CPC ........... *G11C 13/004* (2013.01); *G11C 11/56* (2013.01); *G11C 11/5678* (2013.01); *G11C 13/0002* (2013.01); *G11C 13/0004* (2013.01); *G11C 13/0064* (2013.01); *G11C 13/0069* (2013.01); *G11C 2013/0054* (2013.01); *G11C 2013/0057* (2013.01)

(58) Field of Classification Search
CPC .............. G11C 13/004; G11C 11/5678; G11C 13/0064
USPC .......... 365/148, 158, 163, 171, 173, 185.09, 365/200, 201
See application file for complete search history.

(56) References Cited

U.S. PATENT DOCUMENTS

| | | | | |
|---|---|---|---|---|
| 8,619,450 B2* | 12/2013 | Hamilton | ............... | B82Y 10/00 365/100 |
| 2009/0109728 A1* | 4/2009 | Maejima | ................. | G11C 11/56 365/148 |
| 2009/0290411 A1* | 11/2009 | Xi | ........................ | G11C 11/5664 365/163 |
| 2012/0134202 A1 | 5/2012 | Castro et al. | | |
| 2014/0063904 A1* | 3/2014 | Yon | ....................... | G11C 13/004 365/148 |

FOREIGN PATENT DOCUMENTS

WO     2013089950 A1    6/2013

OTHER PUBLICATIONS

TIPO Office Action dated Jul. 1, 2016 in Taiwan application (No. 104115013).

* cited by examiner

*Primary Examiner* — Tha-O H Bui
(74) *Attorney, Agent, or Firm* — McClure, Qualey & Rodack, LLP

(57) ABSTRACT

A memory operating method comprises the following steps: a first read voltage is applied to the memory cell to read a first group of data levels of the memory cell; and if the data of the memory cell can not be read with the first read voltage, a second read voltage is applied to the memory cell to read a second group of data levels of the memory cell.

18 Claims, 6 Drawing Sheets

MEMORY OPERATING METHOD FOR INCREASING CELL CAPACITY BASED ON RESISTANCE CHARACTERISTIC OF MEMORY AND ASSOCIATED MEMORY DEVICE

This application claims the benefit of U.S. provisional application Ser. No. 62/106,276, filed Jan. 22, 2015, the disclosure of which is incorporated by reference herein in its entirety.

TECHNICAL FIELD

The invention relates in general to a memory operating method and an associated memory device.

BACKGROUND

Multi-level-cell (MLC) for phase change memory (PCM) is a critical technology for achieving memory density and lowering cost-per-bit.

Generally, a PCM cell can be arranged a number of resistance states to store data. That is, data can be stored as resistance states in the PCM cell. However, under a specific read voltage, the number of resistance states that can be arranged into the PCM cell is limited, which in turn restricts the data capacity of the memory cell.

Therefore, there is a need to provide a memory operating method and an associated memory device to increase the data capacity of the memory cell.

SUMMARY

The invention is directed to a memory operating method and an associated memory device, which utilize the nonlinear resistance characteristic of memory to arrange more data levels in a memory cell under different read voltages.

According to an aspect of the present invention, a memory operating method is provided. The memory operating method comprises the following steps: a first read voltage is applied to a memory cell; and a second read voltage is applied to the memory cell when failing to read data of the memory cell under the first read voltage.

According to another aspect of the present invention, a memory device is provided. The memory device comprises a memory array and a controller. The memory array includes at least one memory cell to store data. The controller, coupled to the memory array, applies a first read voltage to the at least one memory cell and applies a second read voltage to the at least one memory cell when failing to read the data under the first read voltage.

Figure 1:
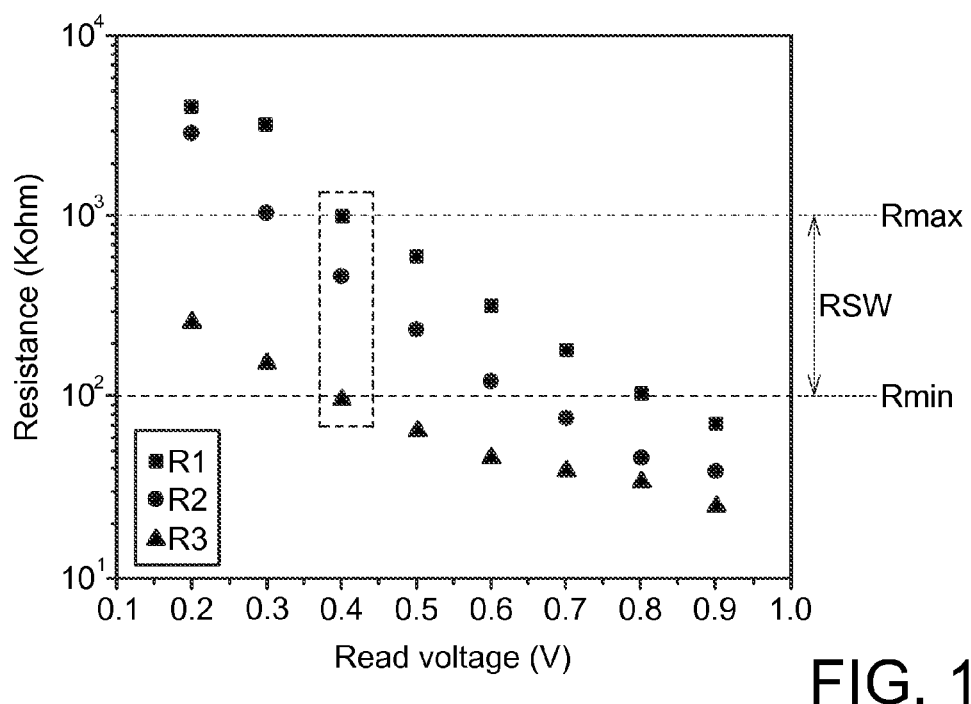
FIG. 1 shows an example of the resistance versus read voltage characteristic of a memory cell.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows an example of the resistance versus read voltage characteristic of a memory cell. The memory cell described herein is, for example, a multi-level-cell (MLC) for phase change memory (PCM). As shown in FIG. 1, the cell resistance (e.g., R1, R2 or R3) decreases as the read voltage increases. For example, the cell resistance R1 is about 100 Kohm under a read voltage of 0.4V, while decreases to about 13 Kohm under a read voltage of 0.9V.

To read out data stored in a memory cell, a memory controller may apply a read voltage to the memory cell, such that the backend circuits (not shown) obtain the cell resistance or cell current information of the memory cell. However, if the obtained cell resistance is too low or too high (or the obtained cell current is too high or too low), the backend circuits will fail to read out the stored data. Taking FIG. 1 as an example, if the cell resistance exceeds the upper limit Rmax (e.g., 1 Mohm) of the resistance sensing window RSW under a read voltage of 0.4V, the cell current detected by the backend circuits would be too low to be used to read out the data stored in the memory cell. On the other hand, if the cell resistance is smaller than the lower limit Rmin (e.g., 100 Kohm) of the resistance sensing window RSW, the cell current detected by the backend circuits would become too large, which in turn causes read disturb. Thus, in the example of FIG. 1, the cell resistances R1, R2 and R3 can only detected by their corresponding read voltages (i.e., voltages about 0.3V to 0.5V). Note that, the cell resistance described herein can be regarded as a data level for storing data.

Generally, the resistance sensing window of a memory cell can only be arranged a limited number of data levels under a specific read voltage. If the resistance sensing window contains too much data levels (e.g., more than 3 or 4 data levels), the occurrence of read errors would increase, such that the data capacity of the memory cell is limited.

To achieve higher cell capacity, the present invention provides a memory operating method and an associated memory device to arrange more data levels in a memory cell. Compared to a typical memory technique using a single voltage to write data, the provided memory operating method and the associated memory device may write extra data into a memory cell under different read voltages, such that the cell capacity can be significantly increased.

Figure 2:
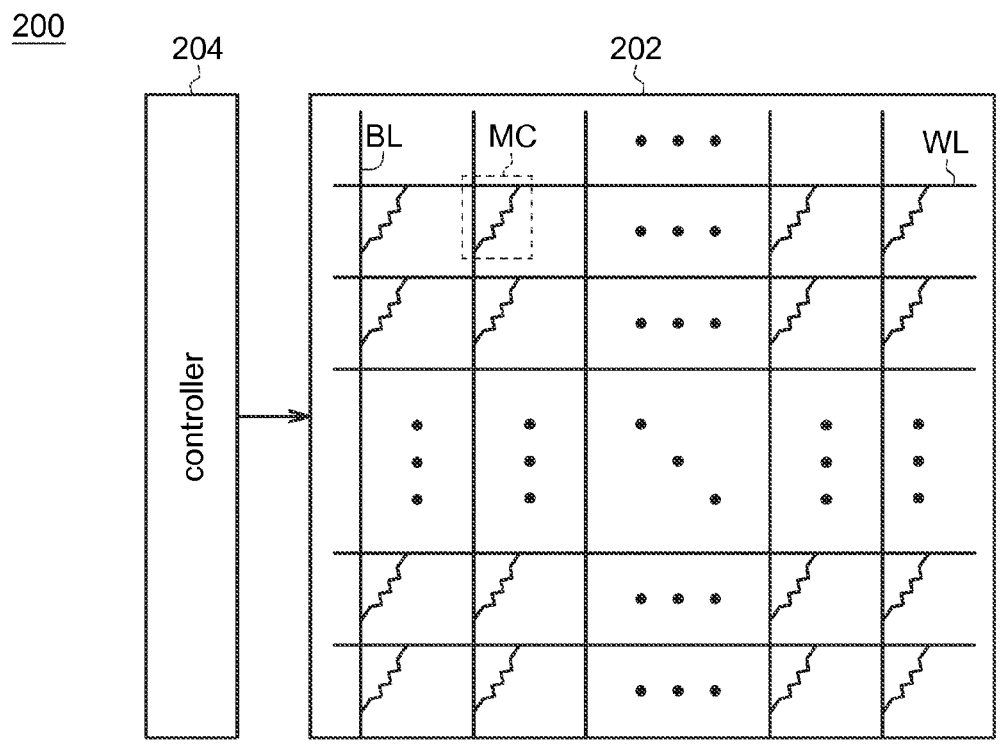
FIG. 2 shows a memory device according to one embodiment of the present invention.
Figure 3:
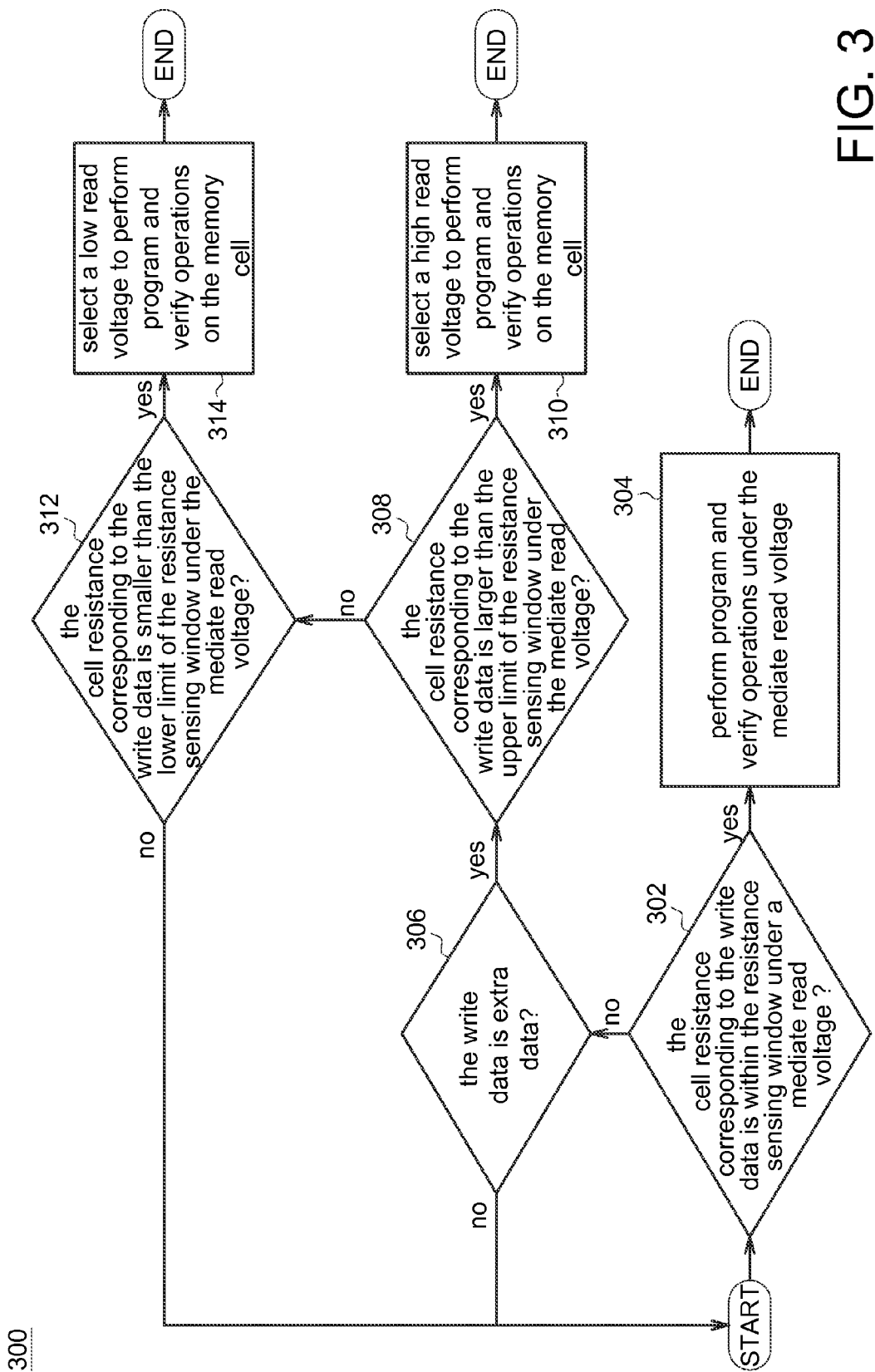
FIG. 3 shows a write flowchart of a memory operating method according to one embodiment of the present invention.

Please refer to FIGS. 2 and 3. FIG. 2 shows a memory device 200 according to one embodiment of the present invention. FIG. 3 shows a write flowchart 300 of a memory operating method according to one embodiment of the present invention. The memory device 200 comprises a memory array 202 and a controller 204. The memory array 202 includes at least one memory cell MC to store data. The controller 204 is coupled to the memory array 202, configured to control the operation of the memory array 202. The memory cell MC is, for example, a MLC for PCM or other type of memory. The controller 204 is, for example, a memory control integrated circuit (IC), a micro processor or other type of control circuit.

The controller 204 may execute the memory operating method shown in FIG. 3 to perform the memory write operation. At step 302, the controller 204 determines whether the cell resistance corresponding to the write data is within the resistance sensing window RSW under a mediate read voltage. If yes, the controller 204 may perform program and verify operations on the memory cell MC under the mediate read voltage, such that the resistance of the memory cell MC reaches a target resistance in the resistance sensing window RSW, as shown in step 304. In this example, the mediate read voltage is about 0.3V to 0.5V, the resistance sensing window RSW is ranged from 100 Kohm to 1 Mohm, but the present invention is not limited thereto. The resistance sensing window RSW can have a different range depending on the sensing capability of the backend circuits. After step 304 is performed, the resistance versus read voltage characteristic of the memory cell MC can be represented as FIG. 1. It is noted that the cell resistances R1, R2 and R3 can only be detected by their corresponding read voltages (i.e., voltages about 0.3V to 0.5V).

At step 306, the controller 204 determines whether the write data is extra data (i.e., data corresponding to other read voltage). If yes, the controller 204 then determines whether the cell resistance corresponding to the write data is larger than the upper limit Rmax of the resistance sensing window RSW under the mediate read voltage at step 308. If the determination result of step 308 is positive, the controller 204 may select a high read voltage larger than the mediate read voltage to perform the program and verify operations on the memory cell MC, such that the resistance of the memory cell MC falls in the resistance sensing window RSW under the high read voltage, as shown in step 310. In this example, the selected high read voltage is about 0.8V to 0.9V, or larger than 0.9V.

At step 312, the controller 204 determines whether the cell resistance corresponding to the write data is smaller than the lower limit Rmin of the resistance sensing window RSW under the mediate read voltage. If yes, the controller 204 may select a low read voltage smaller than the mediate read voltage to perform the program and verify operations on the memory cell MC, such that the resistance of the memory cell MC falls in the resistance sensing window RSW under the low read voltage, as shown in step 314. In this example, the selected low read voltage is about 0.1V to 0.2V.

As a brief summary of flowchart 300, the controller 204 may determine whether the cell resistance corresponding to the write data falls in the resistance sensing window RSW under an initial read voltage (e.g., the mediate read voltage). If so, the controller 204 may directly use the initial read voltage to perform the program and verify operations on the memory cell MC. If not, the controller 204 may selects a new read voltage (e.g., either the low read voltage or high read voltage) to perform the program and verify operations on the memory cell MC, such that the resistance of the memory cell MC is within the resistance sensing window RSW under the new read voltage.

Figure 4:
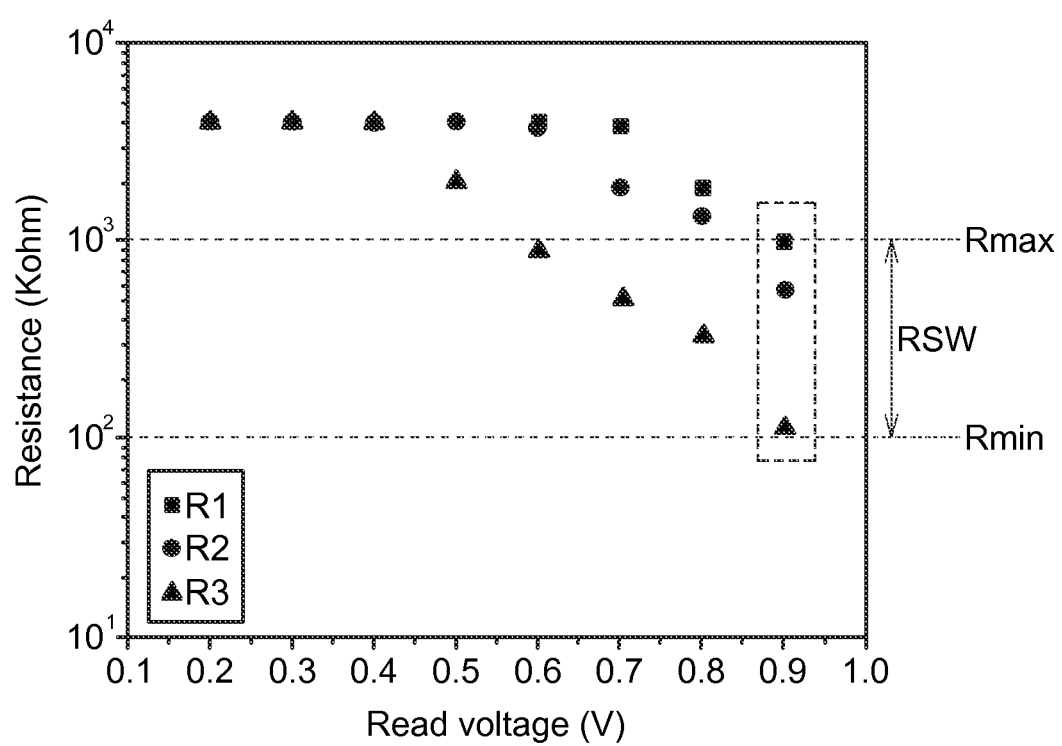
FIG. 4 shows an example of the resistance versus read voltage characteristic of a memory cell.

FIG. 4 shows an example of the resistance versus read voltage characteristic of the memory cell MC after performing the write operation shown in step 310. In the example of FIG. 4, the cell resistances R1, R2 and R3 can only be detected by the high read voltages at 0.8V to 0.9V. If the memory cell MC is read by other lower read voltage(s) (e.g., a voltage of 0.4V), the resultant cell resistance will excess the upper limit Rmax of the resistance sensing window RSW. As a result, the resistance sensing window RSW under high read voltage can be arranged an additional data level group compared to FIG. 1.

Figure 5:
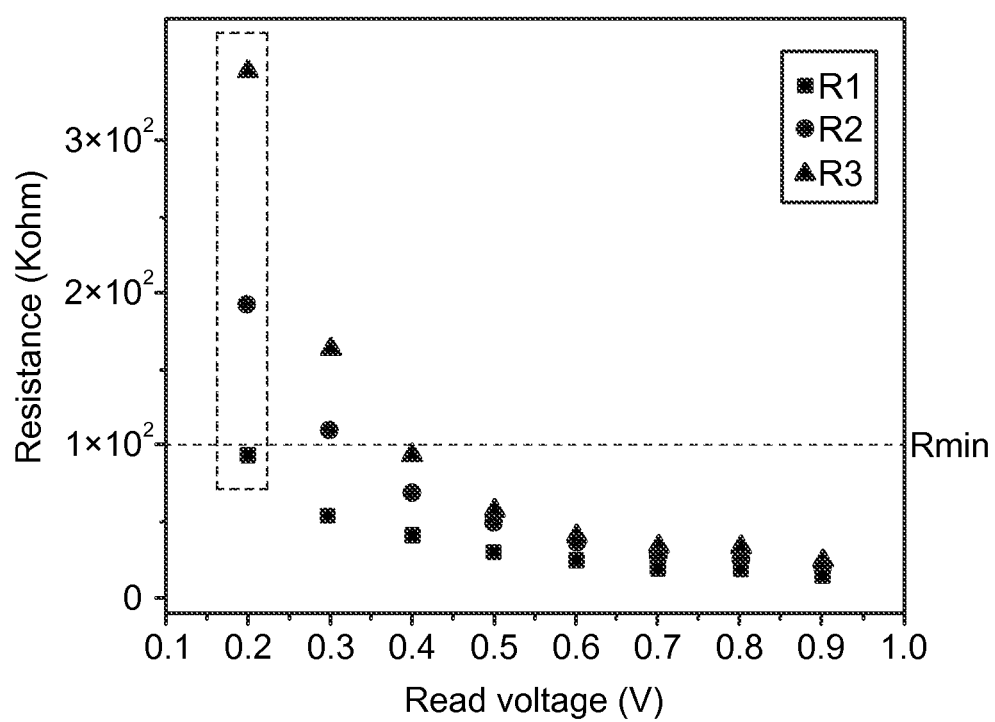
FIG. 5 shows an example of the resistance versus read voltage characteristic of a memory cell.

FIG. 5 shows an example of the resistance versus read voltage characteristic of the memory cell MC after performing the write operation shown in step 314. In the example of FIG. 5, the cell resistances R1, R2 and R3 can only detected by the low read voltages at 0.1V to 0.2V. If the memory cell MC is read by other higher read voltage(s) (e.g., a voltage of 0.4V or 0.9V), the resultant cell resistant will smaller than the lower limit Rmin of the resistance sensing window RSW. As a result, the resistance sensing window RSW under the low read voltage can be arranged an additional data level group compared to FIG. 1.

As a brief summary of FIGS. 1, 4 and 5, it is understood that by using three different read voltages (low, mediate and high read voltages), three independent resistance sensing windows can be provided. Each resistance sensing window only has to store 2 to 3 resistance levels (i.e., data levels) for 3 b/c MLC. In addition, the correct cell resistance levels can only be sensed by their corresponding read voltages, so read interference issue can be avoided. Based on the concept, if the memory cell MC possesses a plurality of data levels to store data, a first read voltage can be used to sense one group of the data levels, a second read voltage can be used to sense another group of the data levels, and a third read voltage can be used to sense still another group of the data levels, etc. Understandably, the present invention is not limited thereto. The magnitudes of read voltages and the number of the data levels arranged in the resistance sensing windows under different read voltages can be adjusted according to practical needs. Moreover, the memory operating method and the associated memory device can also apply more than three read voltages (e.g., extra low read voltage, low read voltage, original voltage, high voltage and extra high read voltage) to perform the read/write operation. Under each read voltage, the memory cells MC can be arranged a corresponding data level group.

Figure 6:
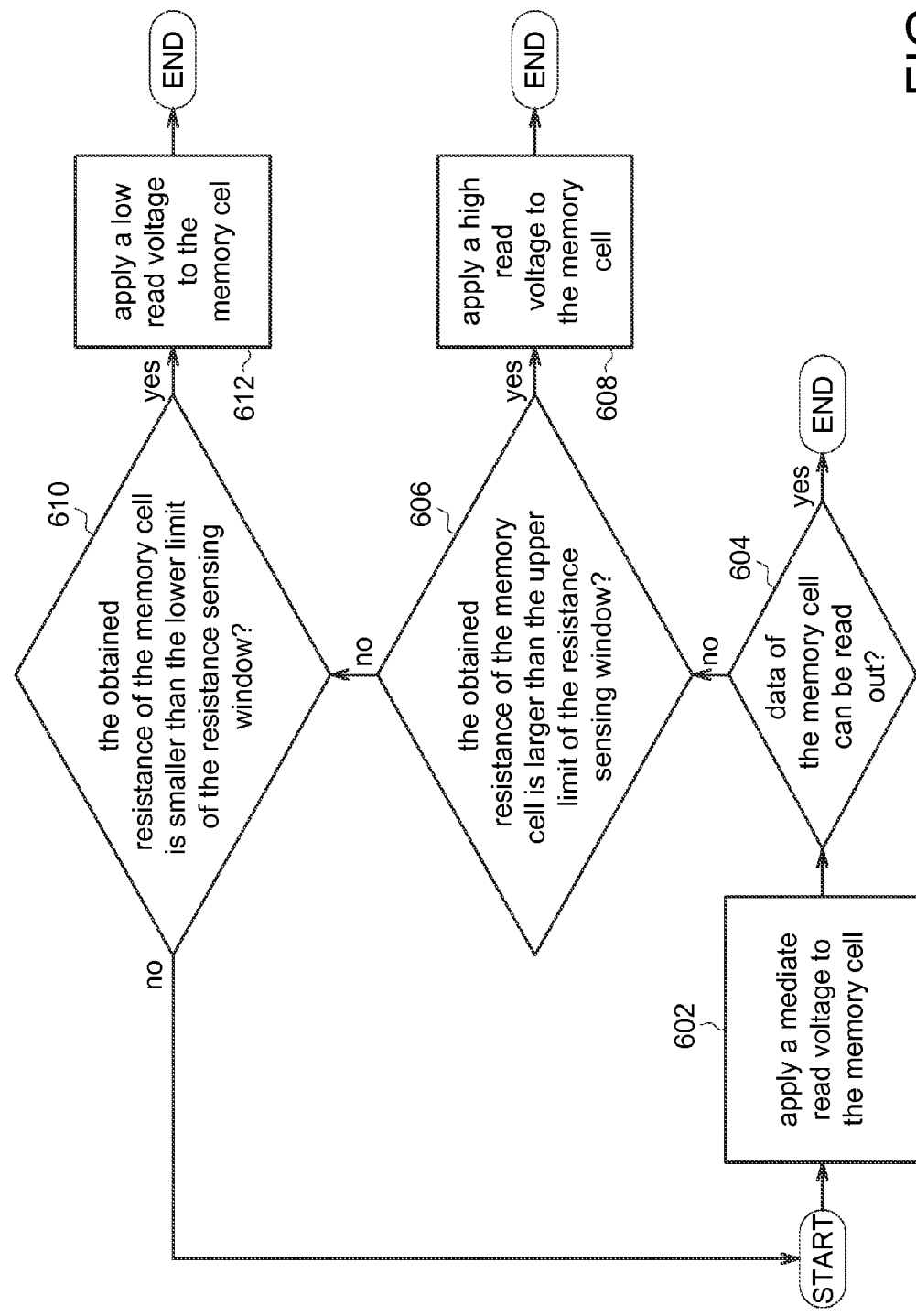
FIG. 6 shows a flowchart of a memory operating method according to one embodiment of the present invention.

FIG. 6 illustrates a flowchart 600 of a memory operating method according to one embodiment of the present invention. The controller 204 may execute the memory operating method shown in FIG. 6 to perform the memory read operation. At step 602, the controller 204 may apply a mediate read voltage (e.g., a voltage about 0.3V to 0.5V) to the memory cell MC through the bit line BL, wherein the voltage applied to the word line WL can be, for example, 1V to 1.5V.

At step 604, the controller 204 checks whether the data of the memory cell MC can be read out. If yes, the controller 204 completes the read operation for the memory cell MC. If not, the controller 204 then determines whether the obtained resistance of the memory cell MC is larger than the upper limit Rmax of the resistance sensing window RSW (or determines whether the cell current is less than a first threshold) according to the cell metric value (e.g., cell resistance or cell current) of the memory cell MC under the mediate read voltage, as shown in step 606. If yes, the controller 204 may apply a high read voltage (e.g., a voltage of 0.8V to 0.9V, or larger than 0.9V) to read the corresponding data level group of the memory cell MC, as shown in step 608.

At step 610, the controller 204 determines whether the resistance of the memory cell MC is smaller than the lower limit Rmin of the resistance sensing window RSW (or determines whether the cell current is larger than a second threshold) according to the cell metric value of the memory cell MC under the mediate read voltage. If yes, the controller 204 may apply a low read voltage (e.g., 0.1V to 0.2V) to read the corresponding data level group of the memory cell MC, as shown in step 612.

Figure 7:
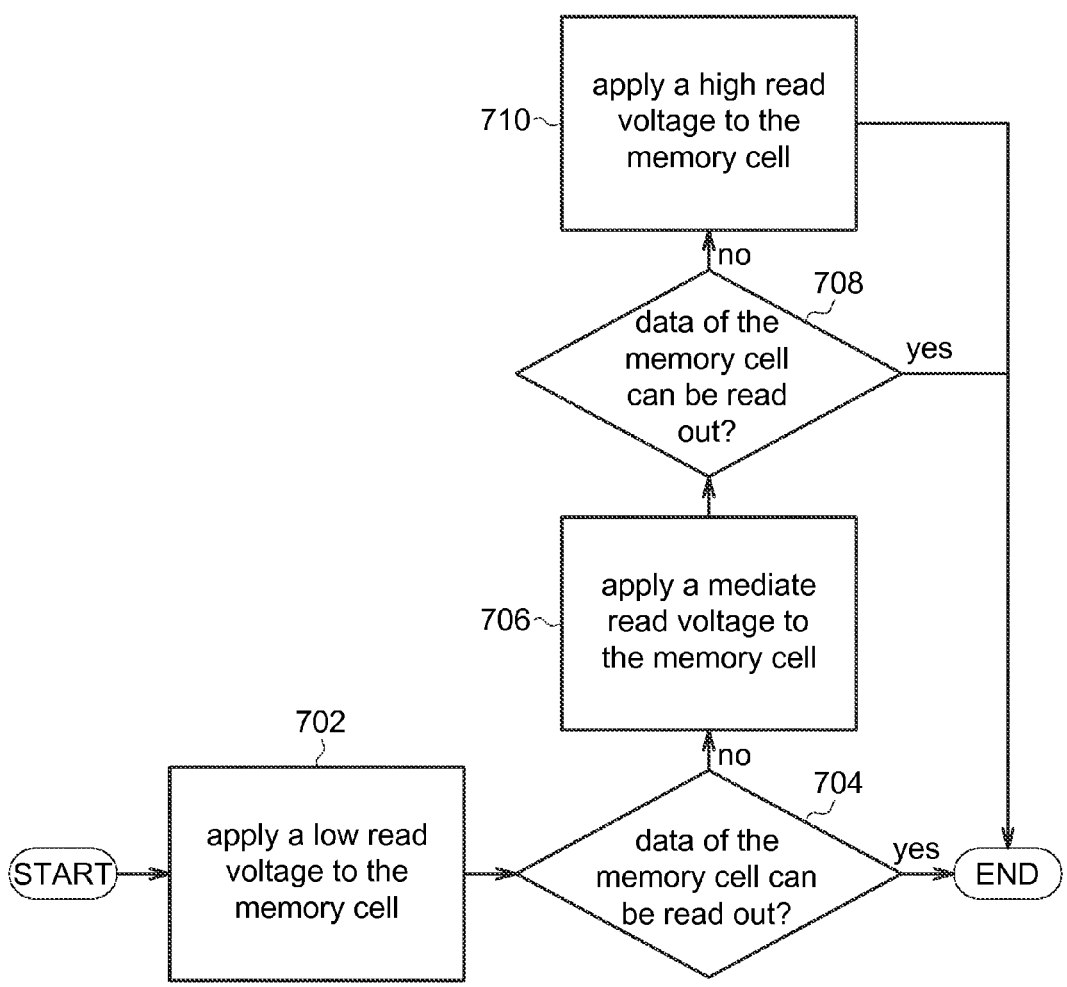
FIG. 7 shows a flowchart of a memory operating method according to another embodiment of the present invention.

FIG. 7 illustrates a flowchart 700 of a memory operating method according to another embodiment of the present invention. The controller 204 may execute the memory operating method shown in FIG. 7 to perform the memory read operation. The main difference between the flowchart 700 and the flowchart 600 is that the flowchart 700 may apply read voltages from low to high to read out the stored data.

As shown in step 702, the controller 204 may apply a low read voltage (e.g., a voltage of 0.1V to 0.2V) to read the memory cell MC. At step 704, the controller 204 checks whether the data of the memory cell MC can be read out. If yes, the controller 204 completes the read operation for the memory cell MC. If not, the procedure continues to step 706.

At step 706, the controller 204 may apply a mediate read voltage (e.g., a voltage of 0.3V to 0.5V) to read the corresponding data level group of the memory cell MC. At step 708, the controller 204 checks whether the data of the memory cell MC can be read out. If yes, the controller 204 completes the read operation for the memory cell MC. If not, the procedure continues to step 710.

At step 710, the controller 204 may apply a high read voltage (e.g., 0.8V to 0.9V, or larger than 0.9V) to read the corresponding data level group of the memory cell MC. At step 712, the controller 204 checks whether the data of the memory cell MC can be read out. If yes, the controller 204 completes the read operation for the memory cell MC.

As a brief summary of the abovementioned read operation, the controller 204 applies a first read voltage to the memory cell MC to read the corresponding first data level group of the memory cell MC. If the first read voltage fails to read the data of the memory cell MC, the controller 204 then applies a second read voltage to the memory cell MC to read the corresponding second data level group of the memory cell MC, etc.

In summary, the memory operating method and the associated memory device of the present invention utilizes the nonlinear resistance characteristic of memory under different read voltages to arrange more data levels in a memory cell. Accordingly, compared to the typical memory read/write technique, the provided memory operating method and associated memory device can significantly increase the cell capacity.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory operating method, comprising:
   applying a first read voltage to a memory cell having a plurality of resistance levels, wherein the memory cell is a multi-level-cell of a phase change memory; and
   applying a second read voltage to the memory cell when failing to read data of the memory cell under the first read voltage;
   wherein the second read voltage is set to larger than the first read voltage when a resistance of the memory cell under the first read voltage is larger than an upper resistance limit of a resistance sensing window; and
   the second read voltage is set to smaller than the first read voltage when the resistance value of the memory cell under the first read voltage is smaller than a lower resistance limit of the resistance sensing window;
   wherein the resistance sensing window has the upper resistance limit and the lower resistance limit between which data corresponding to a resistance level exhibited by the memory cell is configured to be read.

2. The memory operating method according to claim 1, wherein the first read voltage is 0.3V to 0.5V;
   when the resistance of the memory cell under the first read voltage is larger than the upper resistance limit of the resistance sensing window, the second read voltage is 0.8V to 0.9V, or larger than 0.9V; and
   when the resistance value of the memory cell under the first read voltage is smaller than the lower resistance limit of the resistance sensing window, the second read voltage is 0.1V to 0.2V.

3. The memory operating method according to claim 1, wherein the resistance sensing window is ranged from 100 Kohm to 1 Mohm.

4. The memory operating method according to claim 1, further comprising:
   applying a third read voltage to the memory cell when failing to read data of the memory cell under the second read voltage.

5. The memory operating method according to claim 4, wherein the third read voltage is larger than both the second read voltage and the first read voltage.

6. The memory operating method according to claim 5, wherein the first read voltage is 0.1V to 0.2V.

7. The memory operating method according to claim 5, wherein the second read voltage is 0.3V to 0.5V when the resistance of the memory cell under the first read voltage is larger than the upper resistance limit of the resistance sensing window.

8. The memory operating method according to claim 5, wherein the third read voltage is 0.8V to 0.9V, or larger than 0.9V.

9. The memory operating method according to claim 1, wherein the first read voltage is to sense a first group of the data levels, and the second read voltage is to sense a second group of the data levels.

10. The memory operating method according to claim 1, further comprising:
    under the first read voltage, determining whether the resistance of the memory cell corresponding to write data is within the resistance sensing window;
    if yes, programming and verifying the memory cell with the first read voltage; and
    if not, programming and verifying the memory cell with the second read voltage.

11. The memory operating method according to claim 10, wherein the second read voltage is 0.8V to 0.9V, or larger than 0.9V, when the resistance of the memory cell corresponding to the write data exceeds the resistance sensing window under the first read voltage.

12. The memory operating method according to claim 10, wherein the second read voltage is 0.1V to 0.2V when the resistance of the write data is lower than the resistance sensing window.

13. A memory device, comprising:
   a memory array including at least one memory cell having a plurality of resistance levels to store data, wherein the at least one memory cell is a multi-level-cell of a phase change memory; and
   a controller, coupled to the memory array, applying a first read voltage to the at least one memory cell and applying a second read voltage to the at least one memory cell when failing to read the data under the first read voltage;
   wherein the second read voltage is set to larger than the first read voltage when a resistance of the memory cell under the first read voltage is larger than an upper resistance limit of a resistance sensing window; and
   the second read voltage is set to smaller than the first read voltage when the resistance value of the memory cell under the first read voltage is smaller than a lower resistance limit of the resistance sensing window;
   wherein the resistance sensing window has the upper resistance limit and the lower resistance limit between which data corresponding to a resistance level exhibited by the memory cell is configured to be read.

14. The memory device according to claim 13, wherein the first read voltage is to sense one group of the data levels, and the second read voltage is to sense another one group of the data levels.

15. The memory device according to claim 14, wherein the first read voltage is 0.3V to 0.5V.

16. The memory device according to claim 15, wherein the second read voltage is 0.1V to 0.2V when the resistance value of the memory cell under the first read voltage is smaller than the lower resistance limit of the resistance sensing window.

17. The memory device according to claim 15, wherein the second read voltage is 0.8V to 0.9V, or larger than 0.9V when the resistance of the memory cell under the first read voltage is larger than the upper resistance limit of the resistance sensing window.

18. The memory device according to claim 13, wherein the controller determines whether the resistance of the memory cell corresponding to write data is within the resistance sensing window under the first read voltage;
   if yes, the controller programs and verifies the at least one memory cell with the first read voltage; and
   if not, the controller programs and verifies the at least one memory cell with the second read voltage.

* * * * *